(12) United States Patent
Ishibashi

(10) Patent No.: US 9,011,605 B2
(45) Date of Patent: Apr. 21, 2015

(54) SUBSTRATE CLEANING METHOD AND ROLL CLEANING MEMBER

(75) Inventor: Tomoatsu Ishibashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 338 days.

(21) Appl. No.: 13/478,373

(22) Filed: May 23, 2012

(65) Prior Publication Data

US 2012/0312323 A1    Dec. 13, 2012

(30) Foreign Application Priority Data

May 25, 2011    (JP) .................. 2011-116690

(51) Int. Cl.
  *H01L 21/02*    (2006.01)
  *H01L 21/67*    (2006.01)
  *H01L 21/687*    (2006.01)

(52) U.S. Cl.
  CPC ..... *H01L 21/68728* (2013.01); *H01L 21/02074* (2013.01); *H01L 21/67046* (2013.01)

(58) Field of Classification Search
  USPC ....................................... 15/230.16
  See application file for complete search history.

(56) References Cited

U.S. PATENT DOCUMENTS

| | | | |
|---|---|---|---|
| 6,299,698 B1 * | 10/2001 | Emami et al. ............... | 134/6 |
| 6,616,516 B1 * | 9/2003 | Ravkin et al. ............... | 451/194 |
| 6,733,596 B1 * | 5/2004 | Mikhaylichenko et al. ...... | 134/6 |
| 2009/0031512 A1 * | 2/2009 | Sin et al. ............... | 15/77 |

FOREIGN PATENT DOCUMENTS

| | | |
|---|---|---|
| JP | 10-308374 | 11/1998 |
| JP | 2000-15190 | 1/2000 |
| JP | 2000015190 A * | 1/2000 |
| JP | 2002-280344 | 9/2002 |
| JP | 2002-313767 | 10/2002 |
| JP | 2009-117765 | 5/2009 |

OTHER PUBLICATIONS

English Machine Translation of JP 2000-015190 A.*

* cited by examiner

*Primary Examiner* — Nicole Blan
(74) *Attorney, Agent, or Firm* — Wenderoth, Lind & Ponack, L.L.P.

(57) ABSTRACT

There is provided a substrate cleaning method which optimizes the shape of a roll cleaning member and can efficiently clean a substrate surface with a high degree of cleaning and reduce the number of defects remaining on the substrate surface. The substrate cleaning method performs scrub cleaning of a surface of a substrate with a roll cleaning member, having a large number of nodules on the surface and extending linearly over approximately an entire length of a diameter of the substrate and which forms a cleaning area between it and the substrate surface, by bringing the nodules into contact with the substrate surface while rotating the roll cleaning member and the substrate each in one direction. During this scrub cleaning, the area of contact between the nodules and the substrate surface in the cleaning area is made smaller in a forward-direction cleaning area.

7 Claims, 10 Drawing Sheets

SUBSTRATE CLEANING METHOD AND ROLL CLEANING MEMBER

CROSS REFERENCE TO RELATED APPLICATIONS

This document claims priority to Japanese Application Number 2011-116690, filed May 25, 2011, the entire contents of which are hereby incorporated by reference.

BACKGROUND OF THE INVENTION

1. Field of the Invention

The present invention relates to a substrate cleaning method for performing scrub cleaning of a surface of a substrate, such as a semiconductor wafer, with a long cylindrical roll cleaning member by rotating the substrate and the roll cleaning member each in one direction while keeping the roll cleaning member in contact with the surface of the substrate in the presence of a cleaning liquid, and relates to a roll cleaning member for use in the substrate cleaning method.

The substrate cleaning method of the present invention can be applied to cleaning of a surface of a semiconductor wafer, or to cleaning of a surface of a substrate in the manufacturing of an LCD (liquid crystal display) device, a PDP (plasma display panel) device, a CMOS image sensor, etc.

2. Description of the Related Art

As semiconductor devices are becoming finer these days, cleaning of various films, made of materials having different physical properties and formed in a substrate, is widely practiced. For example, in a damascene interconnect forming process for forming interconnects in a substrate surface by filling a metal into interconnect trenches formed in an insulating film on the substrate surface, an extra metal on the substrate surface is polished away by chemical mechanical polishing (CMP) after the formation of damascene interconnects. A plurality of films such as a metal film, a bather film and an insulating film, having different water wetting properties, are exposed on the substrate surface after CMP.

A residue of a slurry (slurry residue) that has been used in CMP, metal polishing debris, etc. exist on the substrate surface having exposed films such as a metal film, a bather film and an insulating film by CMP. If cleaning of the substrate surface is insufficient and residues remain on the substrate surface, the residues on the substrate surface may cause reliability problems such as the occurrence of leak from a residue portion, poor adhesion, etc. It is therefore necessary to clean with a high degree of cleaning the substrate surface on which the plurality of films such as a metal film, a barrier film and an insulating film, having different water wetting properties, are exposed.

As a cleaning method for cleaning a substrate surface after CMP, a scrub cleaning method is known which comprises cleaning a surface of a substrate, such as a semiconductor wafer, with a long cylindrical roll cleaning member (roll sponge or roll brush) by rotating the substrate and the roll cleaning member each in one direction while keeping the roll cleaning member in contact with the surface of the substrate in the presence of a cleaning liquid (see patent literature 1). A roll cleaning member for use in such scrub cleaning generally has a length which is somewhat larger than the diameter of a substrate, and is disposed in such a position that its central axis (rotational axis) is perpendicular to the rotational axis of the substrate. Cleaning characteristics can be obtained by rubbing the surface of the substrate with the roll cleaning member, i.e., by rotating the substrate on the rotational axis while keeping the roll cleaning member in contact with the surface of the substrate over the entire length in the diametrical direction.

A substrate cleaning method has been proposed which cleans a substrate with a sponge brush (cleaning member) of a rotary brush while ejecting a liquid or a gas from a surface of the rotating rotary brush (see patent literature 2). This method can avoid uneven cleaning and prevent clogging of the brush. As an exemplary sponge brush for use in the substrate cleaning method, the patent literature 2 describes a sponge brush having a spiral groove in the peripheral surface so that a flow of a liquid chemical (cleaning liquid), flowing from the center toward the periphery of a substrate, will be created by the rotation of the rotary brush.

The applicant has proposed a substrate processing apparatus which cleans a substrate by causing the substrate and a roll (roll cleaning member) to rub against each other in an area of the substrate, corresponding to approximately half of the diameter of the substrate (see patent literature 3). In this substrate processing apparatus, the roll and a substrate preferably move in opposite directions in the rubbing area between them. The applicant has also proposed a substrate processing apparatus which cleans a peripheral area of a substrate by causing the substrate and a roll (roll cleaning member) to rub against each other solely in the peripheral area of the substrate (see patent literature 4).

A cleaning sponge roller has been proposed which comprises a roll body (roll cleaning member) whose peripheral portion is divided into a central area which is to make contact with an inner area of a surface to be cleaned, and outer end areas which are to make contact with an outer area of the surface to be cleaned (see patent literature 5). The sponge roller is designed such that the strength of contact of the peripheral portion of the roll body with the surface to be cleaned is lower in the central area than in the outer end areas.

CITATION LIST

Patent Literature

Patent literature 1: Japanese Patent Laid-open Publication No. H10-308374
Patent literature 2: Japanese Patent Laid-open Publication No. 2000-15190
Patent literature 3: Japanese Patent Laid-open Publication No. 2002-313767
Patent literature 4: Japanese Patent Laid-open Publication No. 2002-280344
Patent literature 5: Japanese Patent Laid-open Publication No. 2009-117765

When a surface of a substrate is scrub-cleaned with a roll cleaning member, extending over approximately the entire length of the diameter of the substrate, by rubbing the roll cleaning member against the substrate surface while rotating the substrate and the roll cleaning member each in one direction, the substrate surface is cleaned in a linearly-extending cleaning area in contact with the roll cleaning member. The cleaning area can be classified into an opposite-direction cleaning area in which the relative rotational velocity between the substrate and the roll cleaning member is relatively high and high physical cleaning performance can be achieved, and a forward-direction cleaning area in which the relative rotational velocity between the substrate and the roll cleaning member is relatively low and only low physical cleaning performance can be achieved. Depending on the cleaning conditions, there may be a region, in which the relative rotational velocity between the substrate and the roll cleaning member is zero, in the forward-direction cleaning area. In such a region and its vicinity, the roll cleaning member merely presses on the substrate without rubbing against it. Therefore, back contamination of the substrate surface can occur by contact with the roll cleaning member.

The patent literatures 1 to 5 are not directed to optimization of the shape of a roll cleaning member for use in scrub cleaning, taking into consideration the above-described difference in physical cleaning performance in roll scrub cleaning. Therefore, it is considered that the techniques disclosed in the patent literatures may involve the drawback of back contamination of a substrate from a roll cleaning member by cleaning process and require higher cleaning performance than inherent cleaning performance.

SUMMARY OF THE INVENTION

The present invention has been made in view of the above situation. It is therefore an object of the present invention to provide a substrate cleaning method which optimizes the shape of a roll cleaning member and can efficiently clean a substrate surface with a high degree of cleaning while preventing back contamination of the substrate, thereby reducing the number of defects remaining on the substrate surface, and to provide a roll cleaning member for use in the substrate cleaning method.

The present invention provides a substrate cleaning method for performing scrub cleaning of a surface of a substrate with a roll cleaning member, having a large number of nodules on the surface and extending linearly over approximately an entire length of a diameter of the substrate and forms a cleaning area between it and the substrate surface, by bringing the nodules into contact with the substrate surface while rotating the roll cleaning member and the substrate each in one direction. During this scrub cleaning, the area of contact between the nodules and the substrate surface in the cleaning area is made smaller in a forward-direction cleaning area where the relative rotational velocity between the roll cleaning member and the substrate is relatively low than opposite-direction cleaning area where the relative rotational velocity between the roll cleaning member and the substrate is relatively high.

Only low physical cleaning performance can be achieved in the forward-direction cleaning area, where the relative rotational velocity between the roll cleaning member and a substrate is relatively low, in the cleaning area. Further, there may be a region in which the relative rotational velocity between the substrate and the roll cleaning member is zero. In such a region and its vicinity, there is a fear of back contamination of the substrate surface from the roll cleaning member by contact. On the other hand, high physical cleaning performance can be achieved in the opposite-direction cleaning area, where the relative rotational velocity between the roll cleaning member and the substrate is relatively high, in the cleaning area. Therefore, by making the area of contact between the nodules of the roll cleaning member and the substrate surface each other smaller in the forward-direction cleaning area than in the opposite-direction cleaning area, it becomes possible to enhance the degree of cleaning of the substrate surface while reducing the load of cleaning associated with back contamination of the substrate surface, and to broaden the cleaning process window.

Preferably, a cleaning liquid, present on the substrate in the forward-direction cleaning area, is caused to flow from the center toward the periphery of the substrate by the rotation of the roll cleaning member.

The cleaning efficiency can be increased by moving the cleaning liquid, present on the substrate in the forward-direction cleaning area, smoothly from the center toward the periphery of the substrate and discharging the cleaning liquid out of the substrate during cleaning.

The present invention also provides another substrate cleaning method for performing scrub cleaning of a surface of a substrate with a roll cleaning member, having a large number of nodules on the surface and extending linearly over approximately an entire length of a diameter of the substrate and which forms a cleaning area between it and the substrate surface, by bringing the nodules into contact with the substrate surface while rotating the roll cleaning member and the substrate each in one direction. During this scrub cleaning, the nodules are brought into contact with the substrate surface in the cleaning area only in an opposite-direction cleaning area where the relative rotational velocity between the roll cleaning member and the substrate is relatively high and at the outer end, on the opposite side from the opposite-direction cleaning area, of a forward-direction cleaning area where the relative rotational velocity between the roll cleaning member and the substrate is relatively low.

The roll cleaning member thus does not make contact with the substrate surface in the portion, other than the outer end portion, on the opposite side from the opposite-direction cleaning area, of the forward-direction cleaning area. This can prevent back contamination of the substrate surface from the roll cleaning member by contact. Further, the roll cleaning member is supported at both peripheral ends of the substrate along one diameter, while effectively utilizing the outer end portion, on the opposite side from the opposite-direction cleaning area, of the forward-direction cleaning area, where the relative rotational velocity between the substrate and the roll cleaning member is relatively high in the forward-direction cleaning area, for cleaning. This can avoid stress concentration in the center of the substrate, thereby preventing lowering of the cleaning performance.

The present invention also provides a roll cleaning member having a large number of nodules on a surface and which is to extend linearly over approximately an entire length of a diameter of a substrate and forms a cleaning area between it and a surface of the substrate when performing scrub cleaning of the substrate surface by bringing the nodules into contact with the substrate surface while rotating the roll cleaning member and the substrate each in one direction. The distribution density of the nodules is lower in an area in the cleaning area of the roll cleaning member, corresponding to a forward-direction cleaning area where the relative rotational velocity between the roll cleaning member and the substrate is relatively low, than in an area in the cleaning area, corresponding to an opposite-direction cleaning area where the relative rotational velocity between the roll cleaning member and the substrate is relatively high.

Preferably, in the area of the roll cleaning member, corresponding to the forward-direction cleaning area, the nodules are arranged such that a continuous spiral groove which, when the roll cleaning member rotates, acts to cause a cleaning liquid to flow from the center toward the periphery of the substrate, is formed by the nodules.

The present invention also provides another roll cleaning member having a large number of nodules on a surface and which is to extend linearly over approximately an entire length of a diameter of a substrate and forms a cleaning area between it and a surface of the substrate when performing scrub cleaning of the substrate surface by bringing the nodules into contact with the substrate surface while rotating the roll cleaning member and the substrate each in one direction.

The nodules are provided only in an area in the cleaning area of the roll cleaning member, corresponding to an opposite-direction cleaning area where the relative rotational velocity between the roll cleaning member and the substrate is relatively high, and in an area in the cleaning area, corresponding to the outer end, on the opposite side from the opposite-direction cleaning area, of a forward-direction cleaning area where the relative rotational velocity between the roll cleaning member and the substrate is relatively low.

According to the substrate cleaning method of the present invention, by optimizing the shape of a roll cleaning member for use in scrub cleaning, taking into consideration the above-described difference in physical cleaning performance in roll scrub cleaning, makes it possible to efficiently clean a surface of a substrate, such as a semiconductor wafer, with a high degree of cleaning, thereby reducing the number of defects remaining on the substrate surface.

DETAILED DESCRIPTION OF THE PREFERRED EMBODIMENTS

Preferred embodiments of the present invention will now be described with reference to the drawings.

Figure 1:
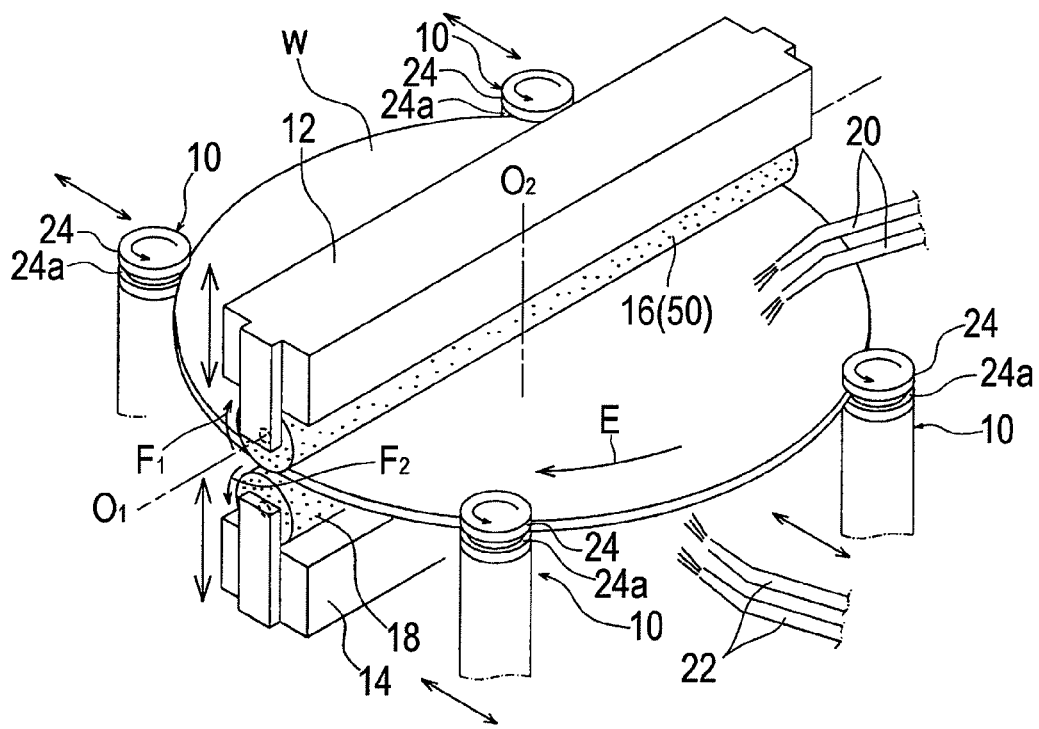
FIG. 1 is a schematic view of an exemplary scrub cleaning apparatus for use in a substrate cleaning method according to the present invention.

FIG. 1 is a schematic view of an exemplary scrub cleaning apparatus for use in a substrate cleaning method according to the present invention. As shown in FIG. 1, this scrub cleaning apparatus includes a plurality of (e.g., four as illustrated) horizontally movable spindles 10 for supporting a periphery of a substrate W, such as a semiconductor wafer, with its front surface facing upwardly, and horizontally rotating the substrate W, a vertically movable upper roll holder 12 disposed above the substrate W supported by the spindles 10, and a vertically movable lower roll holder 14 disposed below the substrate W supported by the spindles 10.

A long cylindrical upper roll cleaning member (roll sponge) 16, e.g., made of PVA, is rotatably supported by the upper roll holder 12. A long cylindrical lower roll cleaning member (roll sponge) 18, e.g., made of PVA, is rotatably supported by the lower roll holder 14.

The upper roll holder 12 is coupled to a not-shown drive mechanism for vertically moving the upper roll holder 12 and rotating the upper roll cleaning member 16, rotatably supported by the upper roll holder 12, in the direction shown by the arrow $F_1$. The lower roll holder 14 is coupled to a not-shown drive mechanism for vertically moving the lower roll holder 14 and rotating the lower roll cleaning member 18, rotatably supported by the lower roll holder 14, in the direction shown by the arrow $F_2$.

An upper cleaning liquid supply nozzle 20, for supplying a cleaning liquid to a front surface (upper surface) of the substrate W, is disposed above the substrate W supported by the spindles 10, while a lower cleaning liquid supply nozzle 22, for supplying a cleaning liquid to a back surface (lower surface) of the substrate W, is disposed below the substrate W supported by the spindles 10.

In the above-structured scrub cleaning apparatus, a peripheral portion of the substrate W is located in an engagement groove 24a formed in a circumferential surface of a spinning top 24 provided at the top of each spindle 10. By spinning the spinning tops 24 while pressing them inwardly against the peripheral portions of the substrate W, the substrate W is rotated horizontally in the direction shown by the arrow E. In this embodiment, two of the four spinning tops 24 apply a rotational force to the substrate W, while the other two spinning tops 24 each function as a bearing and receive the rotation of the substrate W. It is also possible to couple all the spinning tops 24 to a drive mechanism so that they all apply a rotational force to the substrate W.

While horizontally rotating the substrate W and supplying a cleaning liquid (liquid chemical) from the upper cleaning liquid supply nozzle 20 to the front surface (upper surface) of the substrate W, the upper roll cleaning member 16 is rotated and lowered to bring it into contact with the front surface of the rotating substrate W, thereby performing scrub cleaning of the front surface of the substrate W with the upper roll cleaning member 16 in the presence of the cleaning liquid. The length of the upper roll cleaning member 16 is set slightly larger than the diameter of the substrate W. The upper roll cleaning member 16 is disposed in such a position that its central axis (rotational axis) $O_1$ is substantially perpendicular to the rotational axis $O_2$ of the substrate W, and that it extends over the entire length of the diameter of the substrate W. This enables simultaneous cleaning of the entire front surface of the substrate W.

Simultaneously, while supplying a cleaning liquid (liquid chemical) from the lower cleaning liquid supply nozzle 22 to the back surface (lower surface) of the substrate W, the lower roll cleaning member 18 is rotated and raised to bring it into contact with the back surface of the rotating substrate W, thereby performing scrub cleaning of the back surface of the substrate W with the lower roll cleaning member 18 in the presence of the cleaning liquid. The length of the lower roll cleaning member 18 is set slightly larger than the diameter of the substrate W. As with the above-described cleaning of the front surface of the substrate W, the entire back surface of the substrate W can be cleaned simultaneously.

Figure 2:
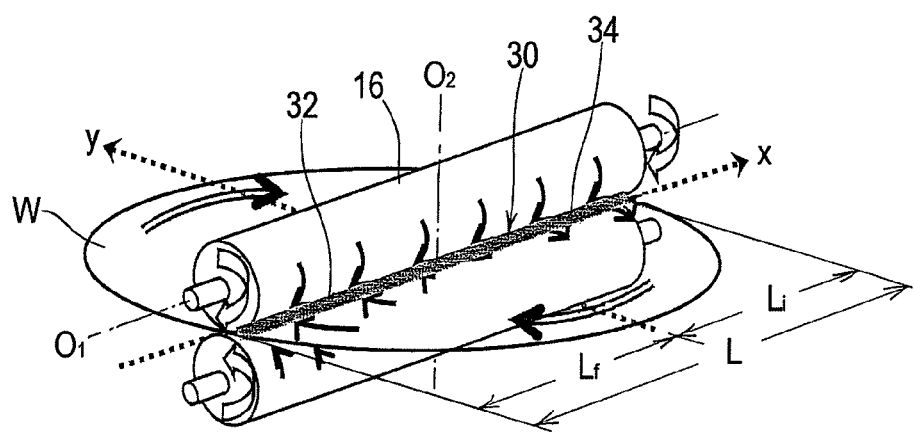
FIG. 2 is a schematic view illustrating the relationship between a substrate and a roll cleaning member in the scrub cleaning apparatus shown in FIG. 1.

When cleaning the front surface of the substrate W with the upper roll cleaning member (hereinafter simply referred to as "roll cleaning member") 16 in the above-described manner, the substrate W and the roll cleaning member 16 make contact with each other in a cleaning area 30 having a length L, extending linearly in the axial direction of the roll cleaning member 16 over the entire length of the substrate W in the diametrical direction, as shown in FIG. 2, and the surface of the substrate W is scrub-cleaned in the cleaning area 30.

Figure 3:
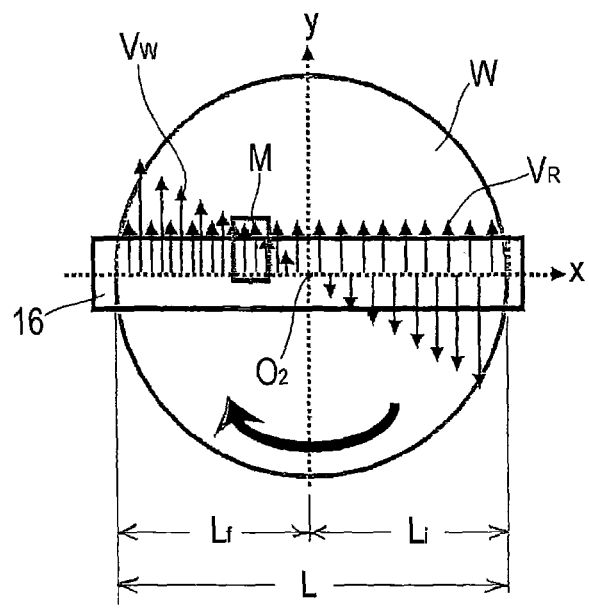
FIG. 3 is a plan view illustrating the relationship between a substrate and a roll cleaning member in the scrub cleaning apparatus shown in FIG. 1.

As shown in FIG. 3, when the substrate W rotates on the rotational axis $O_2$, the magnitude of the rotational velocity $V_W$ of the substrate W in the cleaning area 30 is zero on the rotational axis $O_2$ of the substrate W, and the direction (cleaning direction) of the rotational velocity $V_W$ of the substrate W on one side of the rotational axis $O_2$ is opposite to that on the opposite side of the rotational axis $O_2$. On the other hand, when the roll cleaning member 16 rotates, the magnitude of the rotational velocity $V_R$ of the roll cleaning member 16 in the cleaning area 30 is constant over the entire length of the cleaning area 30, and the direction (cleaning direction) of the rotational velocity $V_R$ is the same on both sides of the rotational axis $O_2$ of the substrate W.

In FIGS. 2 and 3, the x-axis extends along the cleaning area 30, while the y-axis extends on the surface of the substrate W in a direction perpendicular to the x-axis. The rotational axis $O_2$ of the substrate W passes through the origin of the x-y plane.

Therefore, the cleaning area 30 can be classified into a forward-direction cleaning area 32, having a length $L_f$ and lying on one side of the rotational axis $O_2$ of the substrate W, in which the direction of the rotational velocity $V_W$ of the substrate W is the same as the direction of the rotational velocity $V_R$ of the roll cleaning member 16, and an opposite-direction cleaning area 34, having a length $L_i$ and lying on the opposite side of the rotational axis $O_2$ of the substrate W, in which the direction of the rotational velocity $V_W$ of the substrate W is opposite to the direction of the rotational velocity $V_R$ of the roll cleaning member 16.

Figure 4A:
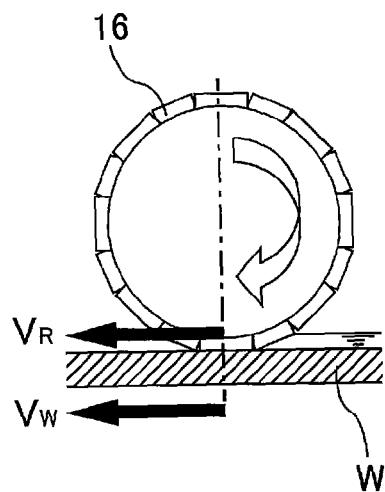
FIG. 4A is a cross-sectional view illustrating a substrate and a roll cleaning member, together with their rotational velocities, in a forward-direction cleaning area.
Figure 4B:
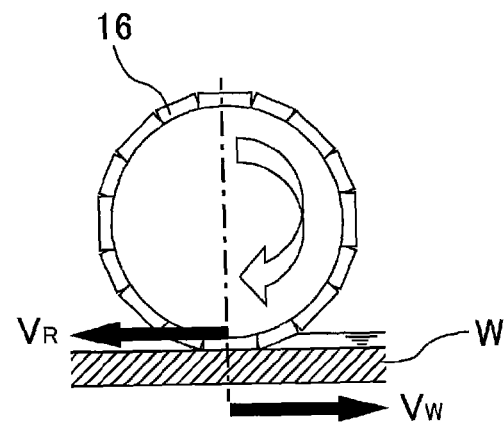
FIG. 4B is a cross-sectional view illustrating the substrate and the roll cleaning member, together with their rotational velocities, in an opposite-direction cleaning area.

As shown in FIG. 4A, in the forward-direction cleaning area 32, the magnitude of the relative rotational velocity between the rotational velocity $V_W$ of the substrate W and the rotational velocity $V_R$ of the roll cleaning member 16 is the absolute value of the difference between the magnitudes of two rotational velocities and is relatively low. On the other hand, in the opposite-direction cleaning area 34, the magnitude of the relative rotational velocity between the rotational velocity $V_W$ of the substrate W and the rotational velocity $V_R$ of the roll cleaning member 16 is the sum of the magnitudes of the two rotational velocities and is relatively high, as shown in FIG. 4B. Thus, depending on the magnitude of the rotational velocity $V_W$ of the substrate W and the magnitude of the rotational velocity $V_R$ of the roll cleaning member 16, there may exist a region M where the magnitude of the relative rotational velocity between them is zero ($V_W=V_R$) and the substrate W is not cleaned.

It is considered that in the non-cleaning region M, the substrate W is merely in contact with the roll cleaning member 16, and no scrub cleaning of the surface of the substrate W with the roll cleaning member 16 is performed. Rather, it is possible that residues, etc. which have adhered to the roll cleaning member 16 may re-adhere to the surface of the substrate W by contact with the substrate surface, thus causing back contamination of the surface of the substrate W.

Figure 5:
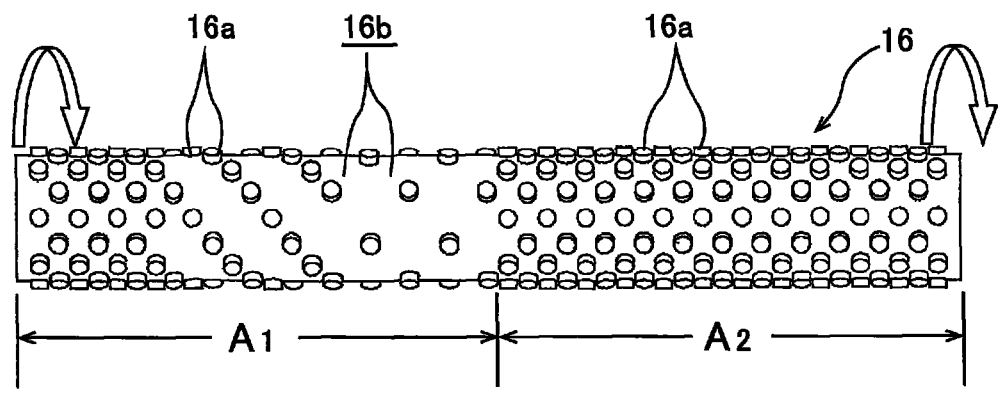
FIG. 5 is a front view of a roll cleaning member according to an embodiment of the present invention, which is used in the scrub cleaning apparatus shown in FIG. 1.

FIG. 5 is a front view of a roll cleaning member 16 according to an embodiment of the present invention, which is provided in the scrub cleaning apparatus shown in FIG. 1. As shown in FIG. 5, the roll cleaning member 16 has a large number of nodules (protrusions) 16a on a surface, and is configured to clean a surface of a substrate W by bringing the surfaces (outer end surfaces) of the nodules 16a into contact with the surface of the substrate W.

As shown in FIG. 2, the roll cleaning member 16 and the surface of the substrate W make contact with each other in the cleaning area 30 having a length L. With the provision of the large number of nodules 16a on the surface of the roll cleaning member 16, the surface of the substrate W makes contact with only the surfaces of the nodules 16a of the roll cleaning member 16 in the cleaning area 30. The cleaning area 30 having a length L can be classified into a forward-direction cleaning area 32 (length $L_f$) where the relative rotational velocity between the roll cleaning member 16 and the substrate W is relatively low, and an opposite-direction cleaning area 34 (length $L_i$) where the relative rotational velocity between the roll cleaning member 16 and the substrate W is relatively high.

In this embodiment, the roll cleaning member 16 is divided in the longitudinal direction into two areas: an area (first cylindrical portion) $A_1$, corresponding to the forward-direction cleaning area; and an area (second cylindrical portion) $A_2$, corresponding to the opposite-direction cleaning area. Because the length of roll cleaning member 16 is greater than the diameter of substrate W as explained above, each of the first cylindrical portion $A_1$ and the second cylindrical portion $A_2$ has an axial length greater than the radius of the substrate W. The distribution density of the nodules 16a provided in the area (first cylindrical portion) $A_1$, corresponding to the forward-direction cleaning area, of the surface of the roll cleaning member 16 is made lower than the distribution density of the nodules 16a provided in the area (second cylindrical portion) $A_2$, corresponding to the opposite-direction cleaning area, of the surface of the roll cleaning member 16.

In this embodiment, when the distribution density of the nodules 16a provided in the area $A_2$, corresponding to the opposite-direction cleaning area, of the surface of the roll cleaning member 16 is taken as 1 (100%), the distribution density of the nodules 16a provided in the area $A_1$, corresponding to the forward-direction cleaning area, is made 0.5 (50%). The ratio of the distribution density of the nodules 16a in the area $A_1$, corresponding to the forward-direction cleaning area, of the surface of the roll cleaning member 16 to the distribution density of the nodules 16a in the area $A_2$, corresponding to the opposite-direction cleaning area, of the surface of the roll cleaning member 16 can, of course, be set arbitrarily depending on the cleaning conditions, etc.

Further, in the area $A_1$, corresponding to the forward-direction cleaning area, of the surface of the roll cleaning member 16 of this embodiment, the nodules 16a are arranged such that a continuous spiral groove 16b which, when the roll cleaning member 16 rotates, acts to cause a cleaning liquid, present in the forward-direction cleaning area, to flow from the center toward the periphery of the substrate W, is formed between nodules 16a adjacent to each other in the longitudinal direction.

The cleaning liquid, present on the substrate W in the forward-direction cleaning area 32, can therefore be moved smoothly from the center toward the periphery of the substrate W and discharged out of the substrate W when the roll cleaning member 16 is rotating during cleaning. This can increase the cleaning efficiency.

Figure 6:
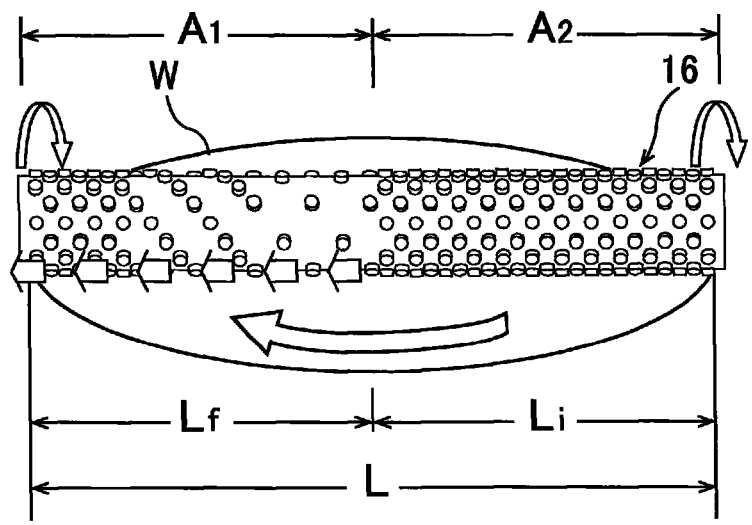
FIG. 6 is a schematic view illustrating scrub cleaning of a substrate using the roll cleaning member shown in FIG. 5.

A substrate cleaning method according to the present invention uses the scrub cleaning apparatus shown in FIG. 1, including the roll cleaning member 16 shown in FIG. 5, and performs scrub cleaning of the surface of the substrate W, which is held in a horizontal position and being rotated by the spindles 10, by bringing the nodules 16a of the roll cleaning member 16 into contact with the substrate surface while rotating the roll cleaning member 16. During the scrub cleaning, a cleaning liquid is supplied from the upper cleaning liquid supply nozzle 20 to the surface of the substrate W. FIG. 6 illustrates the scrub cleaning.

As shown in FIG. 6, in the cleaning area 30 having a length L (see FIG. 2) where the substrate W and the roll cleaning member 16 are in contact with each other, the contact area of the nodules 16a of the roll cleaning member 16 with the surface of the substrate W is smaller in the forward-direction cleaning area 32 having a length $L_f$ (see FIG. 2), where the relative rotational velocity between the roll cleaning member 16 and the substrate W is relatively low, than in the opposite-direction cleaning area 34 having a length $L_i$ (see FIG. 2), where the relative rotational velocity between the roll cleaning member 16 and the substrate W is relatively high.

By thus making the area of contact between the nodules 16a of the roll cleaning member 16 and the surface of the substrate W smaller in the forward-direction cleaning area 32 than in the opposite-direction cleaning area 34, it becomes possible to enhance the degree of cleaning of the substrate surface while reducing the load of cleaning associated with back contamination of the substrate surface, and to broaden the cleaning process window.

By the rotation of the roll cleaning member 16 during the scrub cleaning, the cleaning liquid, existing in the forward-direction cleaning area 32, flows smoothly from the center toward the periphery of the substrate W along the spiral groove 16b formed by the nodules 16a and is discharged out of the substrate W.

The above-described method for cleaning a front surface of a substrate may, of course, be employed for cleaning of a back surface of the substrate. This holds for the below-described embodiment.

In Example 1, cleaning of a substrate surface was carried out under cleaning conditions "a", cleaning conditions "b" or cleaning conditions "c", using the scrub cleaning apparatus shown in FIG. 1, including the roll cleaning member 16 shown in FIG. 5. For the substrate after cleaning, the number of defects remaining on the substrate surface was measured. The results of measurement are shown in FIG. 7.

Figure 7:
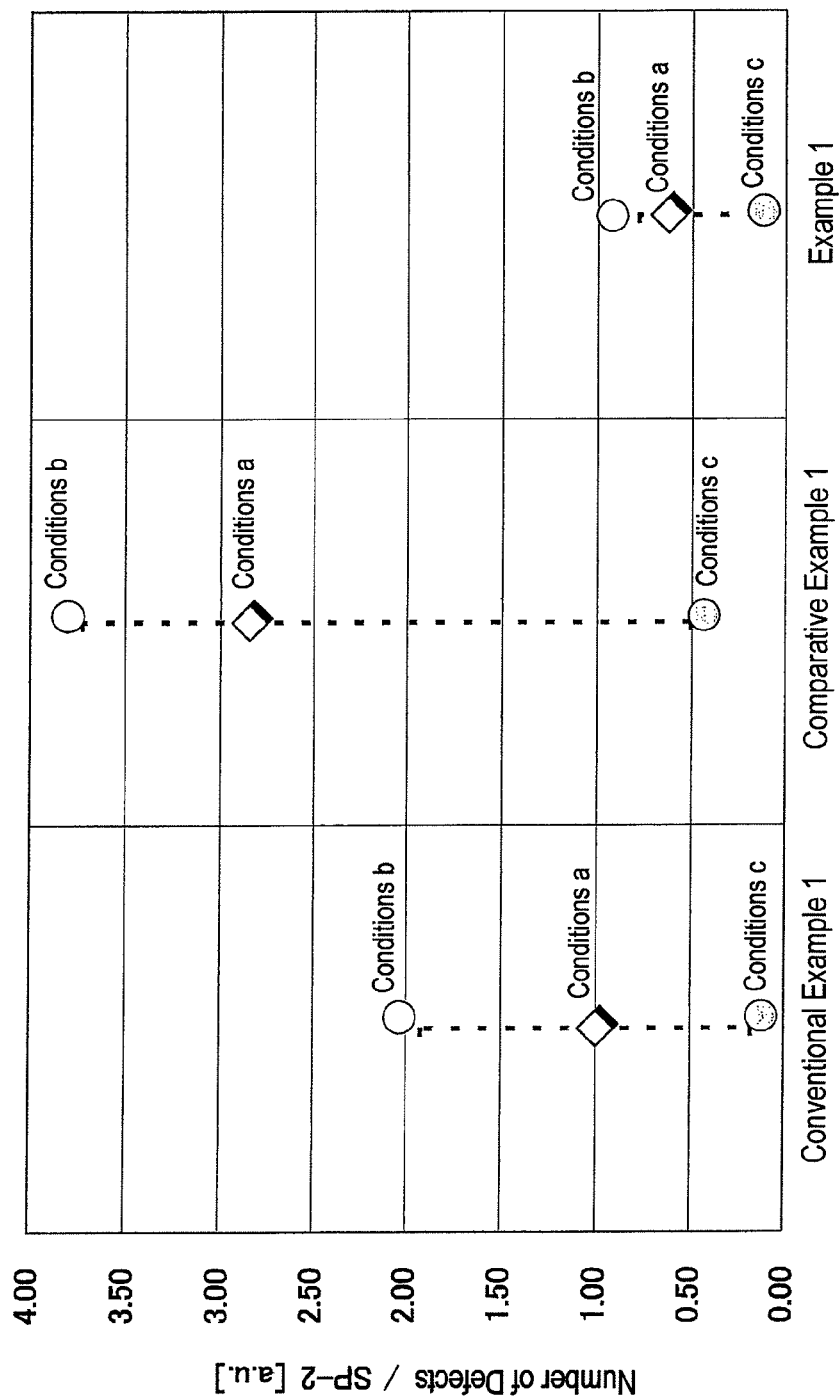
FIG. 7 is a diagram showing the results of measurement of the number of defects remaining on a substrate surface in Example 1, Conventional Example 1 and Comparative Example 1.
Figure 8A:
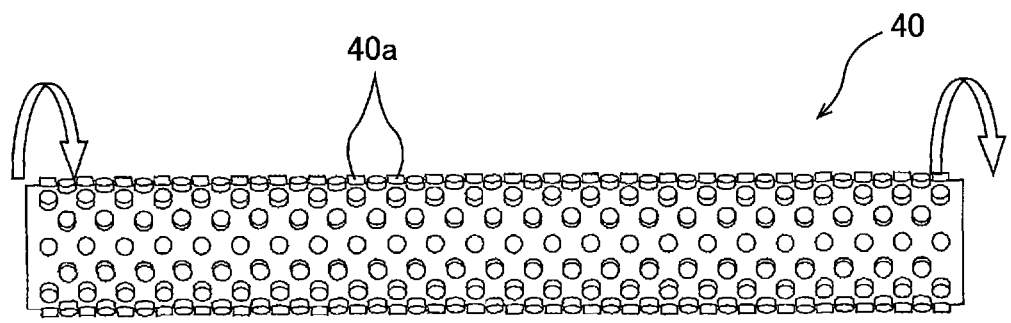
FIG. 8A is a front view of a cleaning member used in Conventional Examples 1 and 2.
Figure 8B:
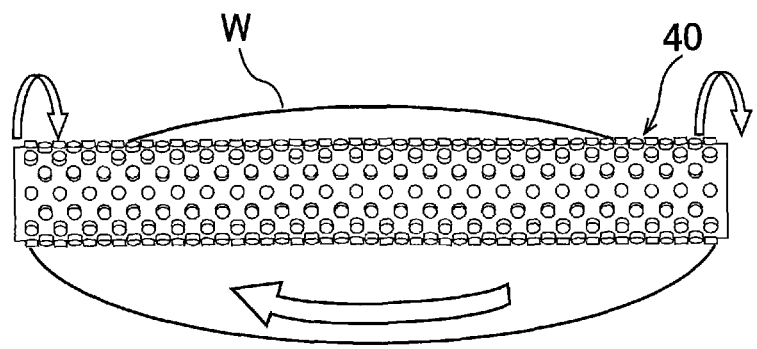
FIG. 8B is a schematic view illustrating scrub cleaning of a substrate by the roll cleaning member shown in FIG. 8A.

In Conventional Example 1, cleaning of a substrate surface was carried out under the same cleaning conditions "a", cleaning conditions "b" or cleaning conditions "c" as in Example 1 except for using a conventional common roll cleaning member 40 having nodules 40a distributed uniformly in the entire surface, as shown in FIG. 8A. For the substrate after cleaning, the number of defects remaining on the substrate surface was measured. The results of measurement are shown in FIG. 7. FIG. 8B illustrates cleaning of a surface of a substrate W by the roll cleaning member 40.

Figure 9A:
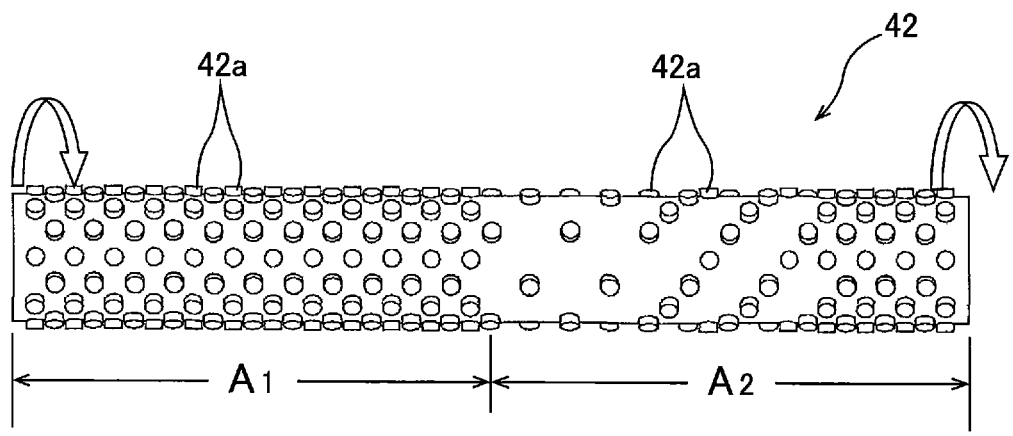
FIG. 9A is a front view of a cleaning member used in Comparative Example 1.
Figure 9B:
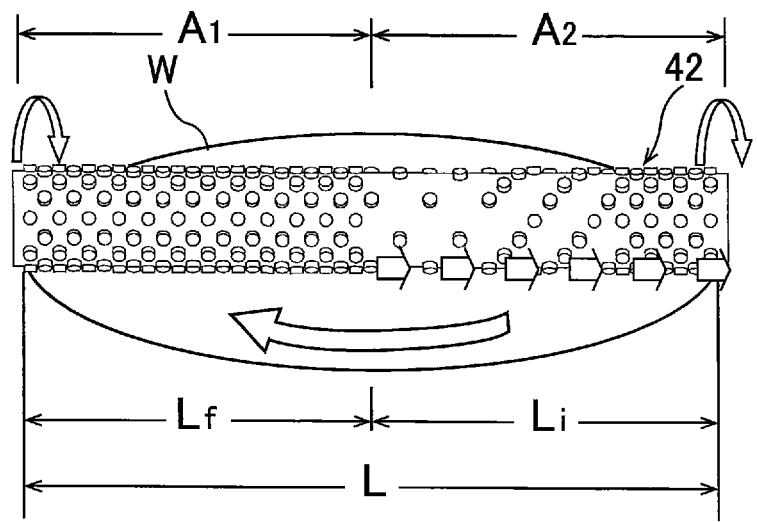
FIG. 9B is a schematic view illustrating scrub cleaning of a substrate by the roll cleaning member shown in FIG. 9A.

In Comparative Example 1, cleaning of a substrate surface was carried out under the same cleaning conditions "a", cleaning conditions "b" or cleaning conditions "c" as in Example 1 except for using a roll cleaning member 42 having nodules 42a whose distribution density is lower (50% in this example) in the area $A_2$ corresponding to the opposite-direction cleaning area than in the area $A_1$ corresponding to the forward-direction cleaning area, as shown in FIG. 9A. For the substrate after cleaning, the number of defects remaining on the substrate surface was measured. The results of measurement are shown in FIG. 7. FIG. 9B illustrates cleaning of a surface of a substrate W by the roll cleaning member 42.

In the graph of FIG. 7, the ordinate represents the number of defects in terms of the ratio (arbitrary unit) to the number of defects, which is made 1.0, remaining on the substrate surface after cleaning carried out under the cleaning conditions "a" in Conventional Example 1.

As can be seen in FIG. 7, the number of defects remaining on the substrate surface of Comparative Example 1 is larger than that of Conventional Example 1. This indicates that the cleaning performance drops when the area of contact between a substrate and the nodules of a roll cleaning member is decreased in the opposite-direction cleaning area 34 shown in FIG. 2. The data in FIG. 7 also shows that the number of defects remaining on the substrate surface of Example 1 is smaller than that of Comparative Example 1 and that of Conventional Example 1. This indicates that a substrate surface can be efficiently cleaned with a high degree of cleaning and the number of defects remaining on the substrate surface can be reduced by decreasing the area of contact between a substrate and the nodules of a roll cleaning member in the forward-direction cleaning area 32 shown in FIG. 2.

Figure 10:
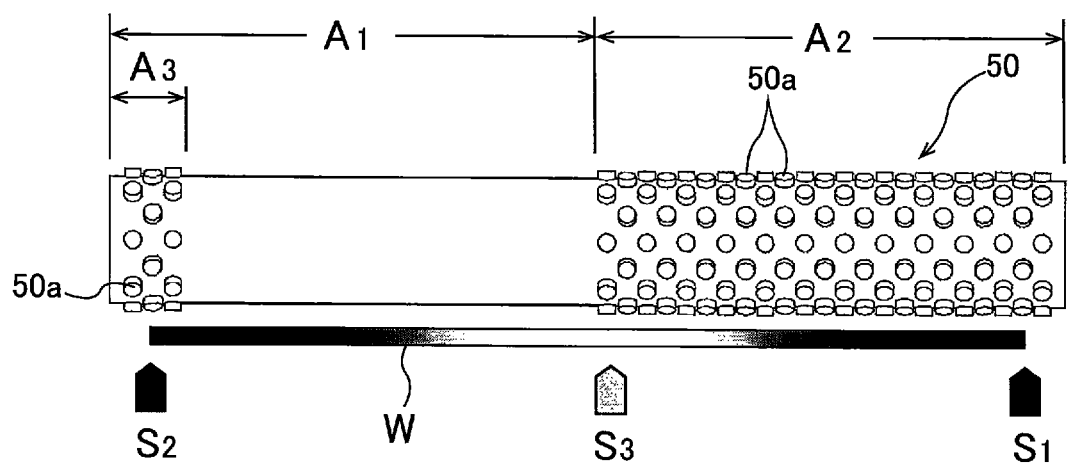
FIG. 10 is a front view showing, together with a substrate, a roll cleaning member according to another embodiment of the present invention.

FIG. 10 is a front view showing, together with a substrate W, a roll cleaning member 50 according to another embodiment of the present invention. The roll cleaning member 50 of this embodiment differs from the roll cleaning member 16 shown in FIG. 5 in the following respects: The roll cleaning member 50 is divided in the longitudinal direction into an area $A_1$, corresponding to the forward-direction cleaning area 32 having a length $L_f$ (see FIG. 2), and an area $A_2$, corresponding to the opposite-direction cleaning area 34 having a length $L_i$ (see FIG. 2). The surface of the roll cleaning member 50 has uniformly-distributed nodules 50a in the area $A_2$, corresponding to the opposite-direction cleaning area. On the other hand, in the area $A_1$ of the surface of the roll cleaning member 50, corresponding to the forward-direction cleaning area, nodules 50a are provided only at the outer end $A_3$, on the opposite side from the opposite-direction cleaning area. That is, no nodule is provided in the portion other than the outer end portion $A_3$, on the opposite side from the opposite-direction cleaning area, in the area $A_1$, corresponding to the forward-direction cleaning area, of the surface of the roll cleaning member 50.

Thus, the roll cleaning member 50 makes contact with the substrate W only on the surfaces of the nodules 50a provided in the area $A_2$, corresponding to the opposite-direction cleaning area, and on the surfaces of the nodules 50a provided at the outer end $A_3$, on the opposite side from the opposite-direction cleaning area, of the area $A_1$ corresponding to the forward-direction cleaning area. The roll cleaning member 50 is thus configured as if it is supported at supporting points $S_1$, $S_2$ lying at both peripheral ends of the substrate W along one diameter.

The roll cleaning member 50 of this embodiment may be used instead of the roll cleaning member 16 of the scrub cleaning apparatus shown in FIG. 1. Using the scrub cleaning apparatus shown in FIG. 1, including the roll cleaning member 50, scrub cleaning of a surface of a substrate W, which is held in a horizontal position and being rotated by the spindles 10, is carried out by bringing the nodules 50a of the roll cleaning member 50 into contact with the substrate surface while rotating the roll cleaning member 50. During the scrub cleaning, a cleaning liquid is supplied from the upper cleaning liquid supply nozzle 20 to the surface of the substrate W.

During the scrub cleaning, the nodules 50a of the roll cleaning member 50 and the surface of the substrate W make contact with each other only in the area $A_2$, corresponding to the opposite-direction cleaning area 34 in the cleaning area 30 shown in FIG. 2, where the relative rotational velocity between the roll cleaning member 50 and the substrate W is relatively high, and at the outer end $A_3$, on the opposite side from the opposite-direction cleaning area, of the area $A_1$, corresponding to the forward-direction cleaning area 32 in the cleaning area 30, where the relative rotational velocity between the roll cleaning member 50 and the substrate W is relatively low.

The roll cleaning member 50 thus does not make contact with the surface of the substrate W in the portion, other than the outer end portion $A_3$, on the opposite side from the opposite-direction cleaning area, of the area $A_1$ corresponding to the forward-direction cleaning area. This can prevent back contamination of the surface of the substrate W from the roll cleaning member 50 by contact. Further, the roll cleaning member 50 is supported at both ends at the supporting points $S_1$, $S_2$, lying at both peripheral ends of the substrate W along one diameter, while effectively utilizing the outer end portion $A_3$, corresponding to that portion of the forward-direction cleaning area in which the relative rotational velocity between the substrate W and the roll cleaning member 50 is relatively high, for cleaning. This can avoid stress concentration in the center of the substrate W, thereby preventing lowering of the cleaning performance.

In Example 2, cleaning of a hydrophilic substrate surface was carried out under predetermined cleaning conditions, using the scrub cleaning apparatus shown in FIG. 1, including the roll cleaning member 50 shown in FIG. 10. For the substrate after cleaning, the number of defects remaining on the substrate surface was measured. The results of measurement are shown in FIG. 11, together with the distribution state of defects on the substrate surface.

In Conventional Example 2, cleaning of a hydrophilic substrate surface was carried out under the same conditions as in Example 2, using the scrub cleaning apparatus shown in FIG. 1, including the roll cleaning member 40 having nodules 40a distributed uniformly over the entire surface, as shown in FIG. 8A. For the substrate after cleaning, the number of defects remaining on the substrate surface was measured. The results of measurement are shown in FIG. 11.

Figure 11:
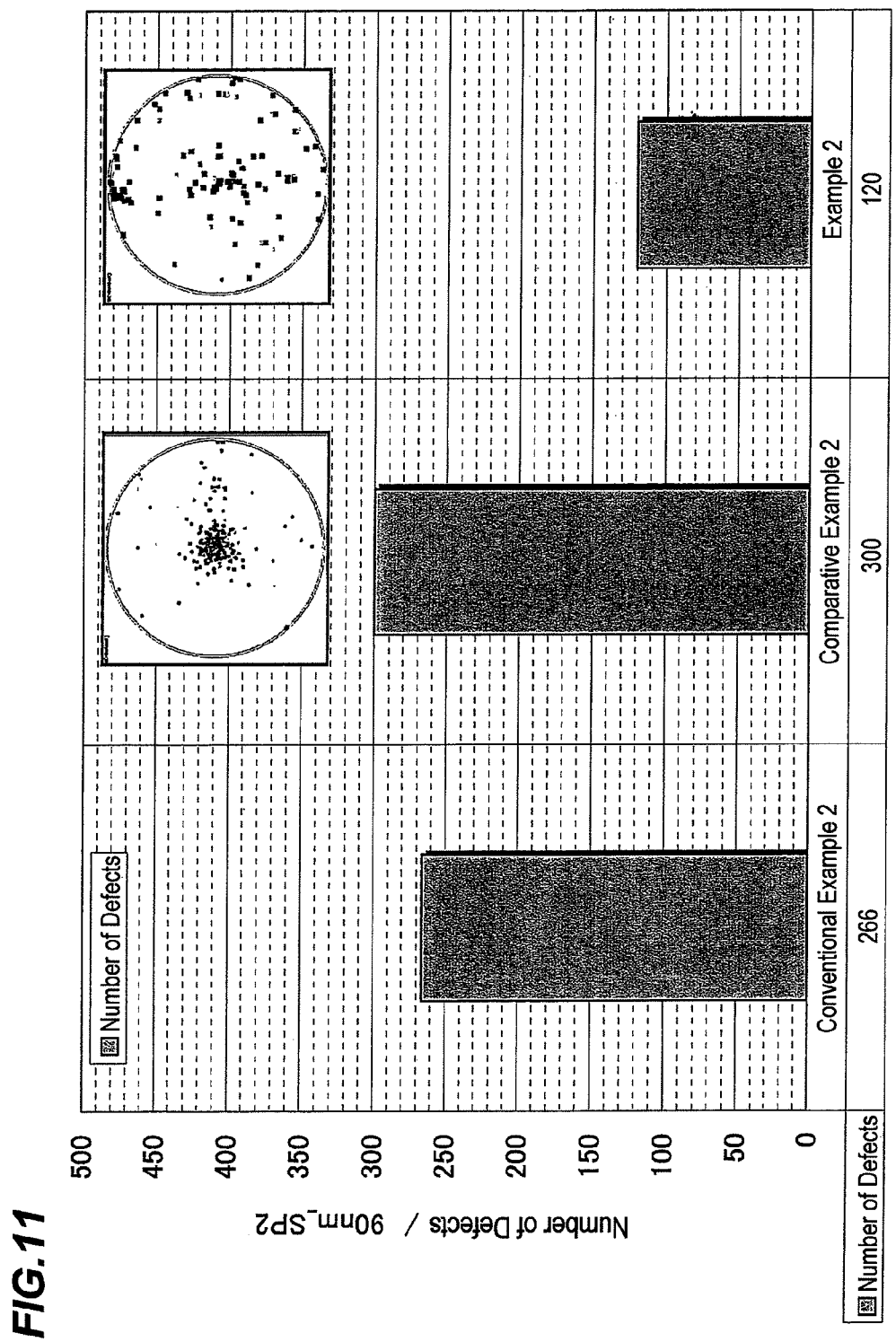
FIG. 11 is a diagram showing the results of measurement of the number of defects remaining on a substrate surface in Example 2, Conventional Example 2 and Comparative Example 2.
Figure 12:
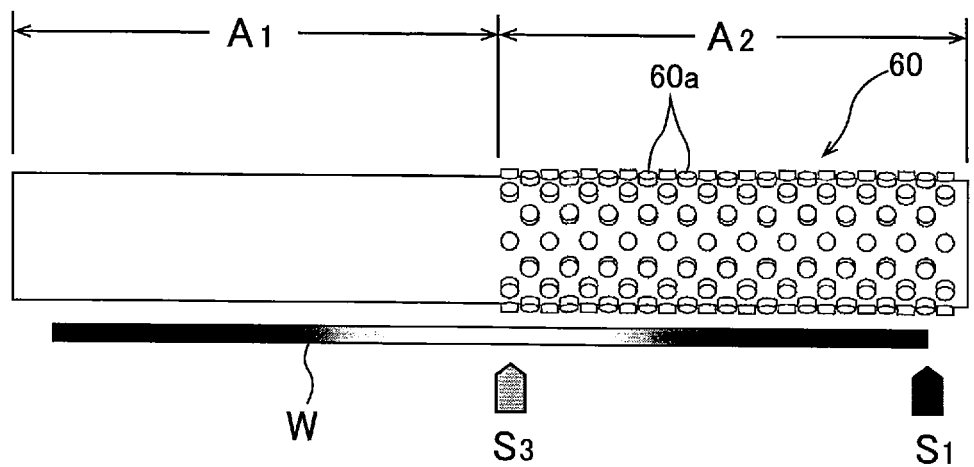
FIG. 12 is a front view showing, together with a substrate, a roll cleaning member used in Comparative Example 2.

In Comparative Example 2, cleaning of a hydrophilic substrate surface was carried out under the same conditions as in Example 2, using the scrub cleaning apparatus shown in FIG. 1, including the roll cleaning member 60 having nodules 60a only in the area $A_2$ corresponding to the opposite-direction cleaning area, i.e., having no nodule in the area $A_1$ corresponding to the forward-direction cleaning area, as shown in FIG. 12. For the substrate after cleaning, the number of defects remaining on the substrate surface was measured. The results of measurement are shown in FIG. 11, together with the distribution state of defects on the substrate surface.

As can be seen in FIG. 11, compared to Conventional Example 2, Comparative Example 2 indicates that depending on the cleaning conditions employed, cleaning performance is lowered, and that defects, remaining on the substrate surface, concentrate in the center of the surface. It is considered in this regard that as shown in FIG. 12, the area $A_2$ of the roll cleaning member 60, corresponding to the opposite-direction cleaning area, is supported at both ends at supporting points $S_1$, $S_3$, lying at a peripheral end and at the center of a substrate W, whereas the area $A_1$, corresponding to the forward-direction cleaning area, is supported only at the supporting point $S_3$, lying at the center of the substrate W. Thus, the area $A_1$ is cantilevered at the central supporting point $S_3$. This will cause stress concentration in a central area of the substrate W through the supporting point $S_3$.

In contrast, as described above, the roll cleaning member 50 of Example 2 is supported at both ends at the supporting points $S_1$, $S_2$, lying at both peripheral ends of a substrate W along one diameter. Accordingly, stress concentration in the center of the substrate W will not occur. Thus, compared to Comparative Example 2, Example 2 can perform cleaning of a substrate surface with a higher degree of cleaning.

While the present invention has been described with reference to preferred embodiments, it is understood that the present invention is not limited to the embodiments described above, but is capable of various changes and modifications within the scope of the inventive concept as expressed herein.

What is claimed is:

1. A substrate cleaning method for performing scrub cleaning of a surface of a substrate, said method comprising:
    rotating the substrate about a central axis of the substrate;
    providing a roll cleaning member having nodules on a surface thereof, a first half of the roll cleaning member comprising a first cylindrical portion having a first surface area, and a second half of the roll cleaning member comprising a second cylindrical portion having a second surface area, the first surface area being smaller than the second surface area, and each of the first cylindrical portion and the second cylindrical portion having an axial length greater than a radius of the substrate;
    wherein a distribution density of the nodules provided on the first cylindrical portion is lower than a distribution density of the nodules provided on the second cylindrical portion;
    rotating the roll cleaning member; and
    during said rotating of the roll cleaning member, bringing the first cylindrical portion into contact with the surface of the substrate over an entirety of a forward-direction cleaning area of the substrate whereat a surface of the first cylindrical portion and the surface of the substrate move in the same direction, while bringing the second cylindrical portion into contact with the surface of the substrate over an entirety of an opposite-direction cleaning area of the substrate whereat a surface of the second cylindrical portion and the surface of the substrate move in opposite directions.

2. The substrate cleaning method according to claim 1, wherein the first cylindrical portion and the second cylindrical portion extend radially from the central axis of the substrate when in contact with the surface of the substrate.

3. The substrate cleaning method according to claim 1, wherein the forward-direction cleaning area and the opposite-direction cleaning area extend radially from the central axis of the substrate in directions opposite to each other.

4. The substrate cleaning method according to claim 1, further comprising causing a cleaning liquid present on the substrate in the forward-direction cleaning area to flow from a center of the substrate toward a periphery of the substrate due to the rotation of the roll cleaning member.

5. A roll cleaning member to be brought into contact with a surface of a substrate, said roll cleaning member comprising:
    a first half comprising a first cylindrical portion, said first cylindrical portion having nodules on a surface thereof and having an axial length greater than a radius of the substrate; and
    a second half comprising a second cylindrical portion, said second cylindrical portion having nodules on a surface thereof and having an axial length greater than the radius of the substrate, a distribution density of said nodules of said first cylindrical portion being lower than a distribution density of said nodules of said second cylindrical portion.

6. The roll cleaning member according to claim 5, wherein said nodules of said first cylindrical portion are arranged in a spiral to form a spiral groove between said nodules.

7. The roll cleaning member according to claim 5, wherein said first cylindrical portion has a surface area smaller than a surface area of said second cylindrical portion.

* * * * *